United States Patent
Wang et al.

(10) Patent No.: US 10,276,326 B1
(45) Date of Patent: Apr. 30, 2019

(54) ILLUMINATION SYSTEMS WITH LIGHT-EMITTING DIODES

(71) Applicant: Apple Inc., Cupertino, CA (US)

(72) Inventors: Paul X. Wang, Cupertino, CA (US); Craig C. Leong, San Jose, CA (US); Joel N. Ruscher, Fremont, CA (US); Reza Nasiri Mahalati, Belmont, CA (US); Liquan Tan, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 124 days.

(21) Appl. No.: 15/158,868

(22) Filed: May 19, 2016

Related U.S. Application Data

(60) Provisional application No. 62/270,833, filed on Dec. 22, 2015.

(51) Int. Cl.

| | |
|---|---|
| *F21K 2/00* | (2006.01) |
| *H01H 13/83* | (2006.01) |
| *F21V 7/22* | (2018.01) |
| *F21V 23/00* | (2015.01) |
| *H05B 37/02* | (2006.01) |
| *H02J 50/10* | (2016.01) |
| *H01L 33/48* | (2010.01) |

(52) U.S. Cl.
CPC ............... *H01H 13/83* (2013.01); *F21K 2/00* (2013.01); *F21V 7/22* (2013.01); *F21V 23/003* (2013.01); *H01L 33/483* (2013.01); *H02J 50/10* (2016.02); *H05B 37/0227* (2013.01); *H01H 2219/06* (2013.01)

(58) Field of Classification Search
CPC ..... H01H 13/83; H01H 2219/06; H02J 50/10; F21K 2/00; F21V 7/22; F21V 23/003; H01L 33/483; H05B 37/0227
See application file for complete search history.

(56) References Cited

U.S. PATENT DOCUMENTS

| | | | |
|---|---|---|---|
| 5,397,867 A * | 3/1995 | Demeo | G02B 6/0043 200/311 |
| 5,960,942 A | 10/1999 | Thornton | |
| 7,365,967 B2 | 4/2008 | Zheng | |
| 7,588,338 B2 | 9/2009 | Chou | |
| 2002/0135457 A1 * | 9/2002 | Sandbach | G06F 3/023 338/47 |
| 2009/0026053 A1 * | 1/2009 | Lerenius | G06F 3/0202 200/314 |

(Continued)

Primary Examiner — Bao Q Truong
(74) Attorney, Agent, or Firm — Treyz Law Group, P.C.; G. Victor Treyz; Kendall W. Abbasi

(57) ABSTRACT

An item may have regions that are illuminated by light from a light source. The light source may be based on components such as light-emitting diodes. Diffusing material, luminescent material, and other light-adjusting materials may be incorporate into the item. The item may include movable structures such as movable keyboard key members. Light-emitting diodes may be mounted on a substrate. The substrate may be coupled to keyboard key members, additional substrates, or other structures in an item. The item may include a layer of fabric and layers of other material. Openings in the layers of material may be configured to receive light-emitting diodes. Opaque layers of material may have patterned openings that help define shapes for the illuminated regions.

28 Claims, 16 Drawing Sheets

(56) References Cited

U.S. PATENT DOCUMENTS

| | | | |
|---|---|---|---|
| 2011/0162945 A1* | 7/2011 | Chen | H01H 13/83 |
| | | | 200/314 |
| 2011/0254775 A1 | 10/2011 | Hsu | |
| 2012/0012448 A1* | 1/2012 | Pance | H01H 13/83 |
| | | | 200/5 A |
| 2013/0334565 A1* | 12/2013 | Hutzler | H01L 29/66333 |
| | | | 257/139 |
| 2014/0262715 A1* | 9/2014 | Lee | B41M 5/267 |
| | | | 200/5 A |
| 2015/0194837 A1* | 7/2015 | Tom | H02J 7/025 |
| | | | 320/108 |
| 2016/0049266 A1* | 2/2016 | Stringer | H01H 13/704 |
| | | | 200/5 A |

* cited by examiner

ILLUMINATION SYSTEMS WITH LIGHT-EMITTING DIODES

This application claims the benefit of provisional patent application No. 62/270,833, filed Dec. 22, 2015, which is hereby incorporated by reference herein in its entirety.

FIELD

This relates generally to illumination, and, more particularly, to systems for providing illumination using light-emitting diodes.

BACKGROUND

Electronic equipment often contains light-emitting diodes. For example, key labels on keys in a keyboard may be backlit with light from light-emitting diodes.

The incorporation of sources of illumination such as light-emitting diodes into keyboards and other items can pose challenges. If care is not taken, key labels or other illuminated regions may not be visible, the efficiency with which illumination is produced may be poor, illuminated structures may not be durable, or illumination systems may be bulkier than desired.

SUMMARY

An item may have regions that are illuminated by light from a light source. The item may have layers of material formed from polymers, fabric, and other materials. The illuminated regions may be formed from transparent windows in opaque layers of material. The transparent windows may include opaque layer openings. Coatings and other materials may overlap the openings.

The light source may be based on components such as light-emitting diodes. The light-emitting diodes may be formed from bare semiconductor dies or semiconductor dies mounted on interposers.

Light-emitting diodes may be mounted on a substrate. The substrate may be coupled to keyboard key members and other structures, additional substrates, or other structures in an item.

Diffusing material, luminescent material, and other light adjusting materials can be incorporate into the item. The item may include movable structures such as movable keyboard key members. For example, the item may be a fabric-covered keyboard having an array of keys. Light-adjusting material may be formed as a coating on a key member, a coating on a layer of material such as a fabric or polymer layer, a portion of a key member or other polymer structure, a polymer substrate or other substrate, or other structure.

Openings may be formed in the layers of material in the item and may be configured to receive light-emitting diodes.

DETAILED DESCRIPTION

Figure 1:
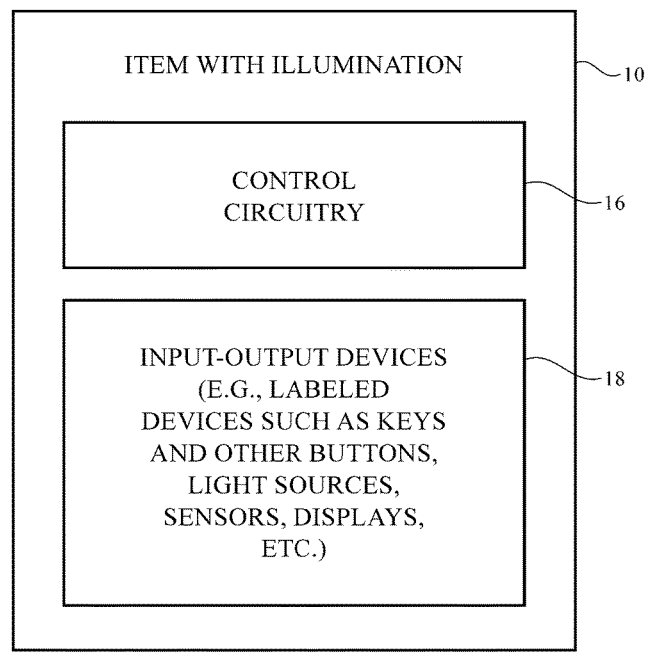
FIG. 1 is a schematic diagram of an illustrative item with an illumination system in accordance with an embodiment.

Fabric, sheets of plastic, layers of printed circuit material, molded plastic parts, and other structures may be used in forming items with illumination systems. These items, which may sometimes be referred to as fabric-based items or electronic devices, may be provided with illumination systems based on light sources such as light-emitting diodes. The illumination systems may be used to illuminate symbols (sometimes referred to as glyphs) that serve as keyboard key labels, may be used to illuminated labels for other components, or may be used to illuminate other regions of interest in an item (e.g., trim structures, portions of a decorative pattern, portions of a light-based status indicator, etc.).

Light-emitting diode illumination systems may be incorporated into electronic devices such as cellular telephones, tablet computers, wrist-watch devices, laptop computers, media players, pendant devices, devices embedded in eyeglasses or other equipment worn on a user's head, or other electronic equipment, may be used in straps, cases, covers, or other accessories for electronic devices (e.g., a cover or other accessory that includes a keyboard), may be used in accessories such as headphones, may be used in forming straps, pockets, walls in bags, or parts of other enclosures, may be used in forming seating or other furniture for a home or office, may be used in forming a seat, dashboard, steering wheel, seatbelt, or other item in a vehicle, may be used in forming part of embedded systems such as systems in which fabric-based equipment is mounted in kiosks, may be used in forming wearable items such as necklaces, wrist bands, arm bands, shoes, or other items of clothing, may be used in forming wallets or purses, may be used in forming cushions, blankets, or other household items, may be used in forming toys, may be used in forming other equipment with circuitry, or may be used in forming structures that implement the functionality of two or more of these items.

Items such as these may include circuitry for supporting input-output features and other functionality. For example, an item may include an illumination system that contains a light source that generates light that is viewable by a user of the item. The light may be used as general purpose illumination (e.g., light to illuminate an interior portion of a bag or other enclosure), may be used as light that illuminates a user's ambient environment (as with a flashlight), may be used to illuminate a symbol or other patterned structure on the surface of a keyboard or other item (e.g., a keyboard key label), may serve as backlight illumination or per-pixel illumination for a display having an array of individually adjustable pixels, may provide illumination for a status indicator (e.g., a one-element or multi-element battery strength indicator, a wireless signal strength indicator, a power status indicator, or other symbol for a status indicator), may support wireless light-based communications (e.g., with external equipment), and/or may be used in other light-based applications. Arrangements in which the circuitry of an item includes a light source for providing illumination for a light-transmitting region such as a symbol (glyph) on a keyboard key (e.g., a keyboard key label or other label, etc.) or other pattern may sometimes be described herein as an example. This is, however, merely illustrative. Arrangements in which illumination systems are incorporated into the circuitry of other types of items (e.g., other suitable structures having illuminated symbols and other light-transmitting regions) and in which other types of illumination are generated may be used, if desired.

An illustrative arrangement for an item that includes circuitry with one or more light sources is shown in FIG. 1. Item 10 may be a fabric-based item such as a fabric-covered keyboard or other item that includes fabric or may be an item that does not include fabric. In configurations in which item 10 includes fabric, the fabric for item 10 may form all or part of a housing wall for item 10, may form internal structures for item 10, may form surface structures for item 10, or may form other fabric-based structures. The fabric of item 10 may be soft (e.g., item 10 may have a fabric surface that yields to a light touch), may have a rigid feel (e.g., the surface of item 10 may be formed from a stiff fabric), may be coarse, may be smooth, may have ribs or other patterned textures, and/or may be formed as part of a structure that has portions formed from non-fabric structures of plastic, metal, glass, crystalline materials, ceramics, or other materials.

Item 10 may have control circuitry 16. Control circuitry 16 may include storage and processing circuitry for supporting the operation of item 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of item 10. The processing circuitry may be based on one or more microprocessors, microcontrollers, digital signal processors, baseband processors and other wireless communications circuits, power management units, audio chips, application specific integrated circuits, etc.

Input-output circuitry in item 10 such as input-output devices 18 may be used to allow data to be supplied to item 10 and to allow data to be provided from item 10 to external devices. During operation, control circuitry 16 may use input-output devices 18 to gather input from a user, external equipment, and/or the environment around item 10. Control circuitry 16 may also use input-output devices 18 to provide output to a user or external equipment.

Input-output devices 18 may include switches, buttons, joysticks, scrolling wheels, touch pads, key pads, keyboards, microphones, speakers, tone generators, vibrators, cameras, sensors such as touch sensors, capacitive proximity sensors, light-based proximity sensors, ambient light sensors, compasses, gyroscopes, accelerometers, moisture sensors, force sensors, data ports, displays, and other input-output devices. Keys, buttons, status indicators, displays, trim structures, and other portions of item 18 may be illuminated. For example, light-emitting diodes, lamps, electroluminescent panels, or other sources of light may be used in illuminating patterned openings. The patterned openings may pass through layers of fabric and/or other materials in item 10 and may form symbols (e.g., letters and other alphanumeric characters, icons, etc.) or other illuminated shapes. The symbols or other patterned openings may form labels on keys, buttons, or other input-output devices, may form labels on other illuminated structures, may form trim for a component (e.g., a halo surrounding a key), or may form other suitable illuminated areas. In some arrangements, transparent material (e.g., clear material, translucent material, and/or material that includes electroluminescent substances such as phosphors) may be formed in an opening and/or may overlap and opening. Light-transmitting windows in opaque structures may be formed from openings and optional transparent material overlapping the openings.

Arrangements in which patterned openings or other transparent structures in one or more layers in item 10 are used in forming illuminated letters or other symbols that serve as labels for input-output components such as keys and buttons may sometimes be described herein as an example. In general, however, input-output devices 18 may include one or more light sources that provide any suitable type of illumination for item 10.

Figure 2:
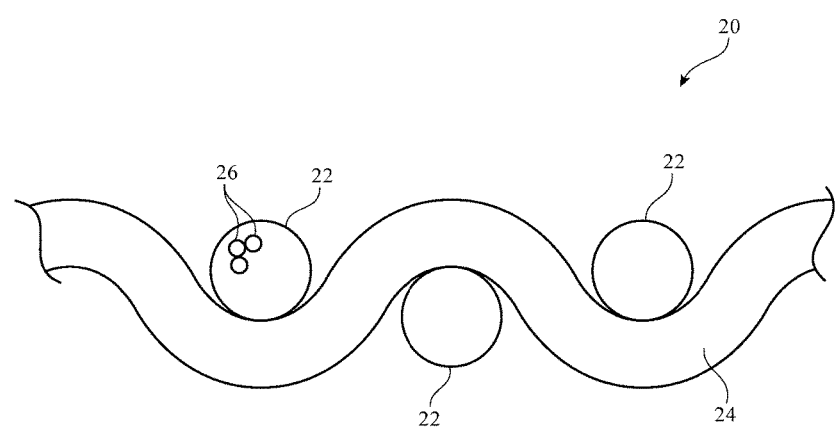
FIG. 2 is a cross-sectional side view of illustrative fabric in accordance with an embodiment.

Fabric for item 10 may be formed from intertwined strands of material. A cross-sectional side view of an illustrative layer of fabric for item 10 is shown in FIG. 2. As shown in FIG. 2, fabric 20 may include strands of material such as strands 22 and strands 24. With one suitable arrangement, fabric 20 may be a woven fabric (e.g., strands 22 may be warp strands and strands 24 may be weft strands). Other arrangements may be used for intertwining strands of material for forming fabric 20 for item 10, if desired. In general, fabric 20 may be woven, knitted, braided, may be intertwined to form felt, or may contain strands of material that have been intertwined using other intertwining techniques. In some arrangements, fabric 20 may include coatings (e.g., polymer coatings to prevent accumulation of dirt, materials that serve as moisture barrier layers, wear resistant coatings, transparent coatings such as patterned translucent coatings, etc.). These coating materials may penetrate into fabric 20 and/or may form layers on the inner and/or outer surfaces of fabric 20.

The strands of material that form the fabric may be monofilaments, may be multifilament strands (sometimes referred to herein as yarns or threads), may be formed from metal (e.g., metal monofilaments and/or yarns formed from multiple monofilament wires), may be formed from dielectric (e.g., polymer monofilaments and yarns formed from multiple polymer monofilaments), may include dielectric cores covered with conductive coatings such as metal (e.g., metal coated dielectric monofilaments and yarns of metal coated polymer-core monofilaments may be used to form conductive monofilaments and conductive yarns, respectively), may include outer insulating coatings (e.g., coatings of polymers or other dielectrics may surround each metal-clad polymer monofilament or each collection of metal-clad polymer monofilaments in a yarn, polymer insulation may enclose a multifilament metal wire, etc.), or may be other suitable strands of material for forming fabric.

As shown in the illustrative configuration of fabric 20 of FIG. 2, for example, strands such as strands 22 and 24 may be formed from strands of yarn that each contain multiple monofilaments 26. Configurations in which the fabric is formed from yarns (e.g., multifilament strands of material that are insulating or that contain metal wires and/or metal coatings on polymer monofilaments to render the yarns conductive) may sometimes be described herein as an example. This is, however, merely illustrative. Fabric 20 may be formed using monofilaments, multifilament strands of material (yarns), combinations of these arrangements, etc. The diameter of strands 22 and 24 that are formed from yarns containing multiple monofilaments may be, for example, 0.25 mm, may be 0.1 to 0.5 mm, may be more than 0.2 mm, may be less than 2 mm, or may be any other suitable diameter (width).

To allow light to pass through a layer formed from fabric and/or other materials in item 10, the layer of material in item 10 may be provided with transparent regions. The transparent regions may be formed from air-filled openings in opaque fabric and/or other opaque materials, may be formed from openings that are filled with transparent material (e.g., haze-free clear material or hazy translucent material, transparent fabric, or other transparent material), or may be formed from other structures that allow light to pass. In some configurations, an opaque fabric coating layer or other opaque layer (e.g., a layer of black ink on a key member or other structure) may be provided with a patterned opening in addition to or instead of providing fabric 20 with patterned openings. Combinations of these approaches and/or other arrangements for providing illuminated structures in item 10 may be used, if desired.

Figure 3:
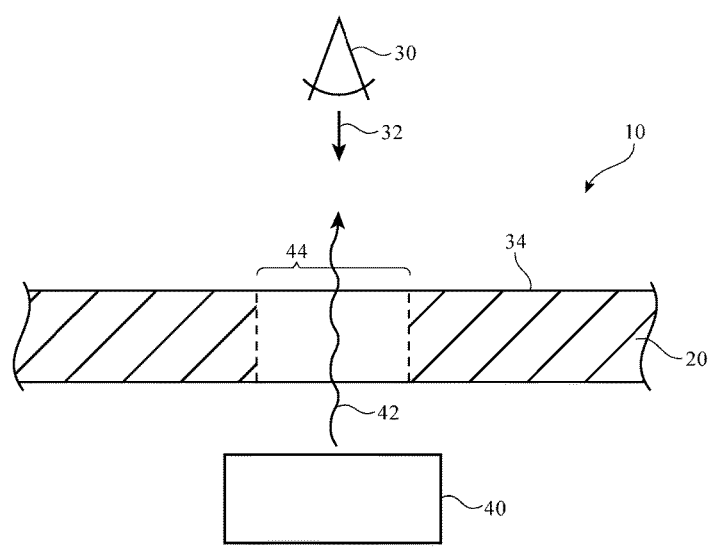
FIG. 3 is a cross-sectional side view of a layer such as a fabric layer or polymer layer with an illuminated region in accordance with an embodiment.

A side view of an illustrative item having a layer of material such as a fabric layer or other layer with an opening is shown in FIG. 3. As shown in FIG. 3, a viewer such as viewer 30 may view exterior surface 34 of item 10 in direction 32. Item 10 may include a layer material such as layer 20 that forms outer surface 34. Layer 20 may include one or more layers of fabric or other materials (e.g., layer 20 may be a layer of fabric and/or may have other layers of material such as plastic layers or other layers of material, and/or other structures). A light source such as light source 40 may be formed in the interior of item 10. Light source 40 may be formed from one or more light-emitting diodes (e.g., organic light-emitting diodes, light-emitting diode dies formed from crystalline semiconductor, quantum dot light-emitting diodes, light-emitting diodes with phosphors, etc.) or may be formed from other light-emitting structures. With one illustrative configuration, which may sometimes be described herein as an example, light sources for item 10 such as light source 40 may be formed from micro-light-emitting diodes (e.g., small crystalline light-emitting diodes having dimensions of 100 microns or less, 200 microns or less, 20-200 microns, more than 10 microns, less than 500 microns, or other suitable size). Other types of light-emitting device (e.g., lasers, electroluminescent panels, etc.) may be used in providing illumination for item 10 if desired. The use of micro-light-emitting diodes for forming light source(s) 40 is merely illustrative. Light sources for item 10 may generate light at visible wavelengths, infrared wavelengths, and/or ultraviolet wavelengths (see, e.g., light 42 of FIG. 3). If desired, luminescent material (e.g., phosphors formed from phosphorescent materials, fluorescent dyes, a polymer or other material containing quantum dots, etc.) may be used in converting light to desired wavelengths.

Layer 20 may have openings such as opening 44. Opening 44 (or a set of openings such as opening 44) may have the shape of an alphanumeric character or other symbol (glyph), may serve as a label for a component or other label or trim, or may have any other suitable shape. As shown in FIG. 3, opening 44 (i.e., the symbol, label, or other patterned structure formed from opening 44 or set of openings 44) may be illuminated with illumination 42 (i.e., illumination 42 may serve as backlight for an illuminated area formed from opening 44). Because opening 44 may have a shape that forms a symbol or other desired pattern, openings such as opening 44 of FIG. 3 may sometimes be referred to as patterned openings or illuminated regions.

Openings such as opening 44 of FIG. 3 may be formed by stamping (punching), cutting, machining, plasma cutting, waterjet cutting, heating, ablation, chemical removal (e.g., polymer dissolving techniques, metal etching techniques, etc.), laser-based techniques (sometimes referred to as laser hole formation or laser drilling), and/or other suitable material removal techniques. Openings such as opening 44 may also be formed during the process of fabricating some or all of layer 20 (e.g., by molding openings into layer 20 as layer 20 is formed during a plastic molding process, by intertwining strands of material so that openings are formed as layer 20 is constructed, or by using other fabrication techniques in which openings such as opening 44 are formed during fabrication of layer 20 rather than by removing material from layer 20 after layer 20 has been fabricated).

Figure 4:
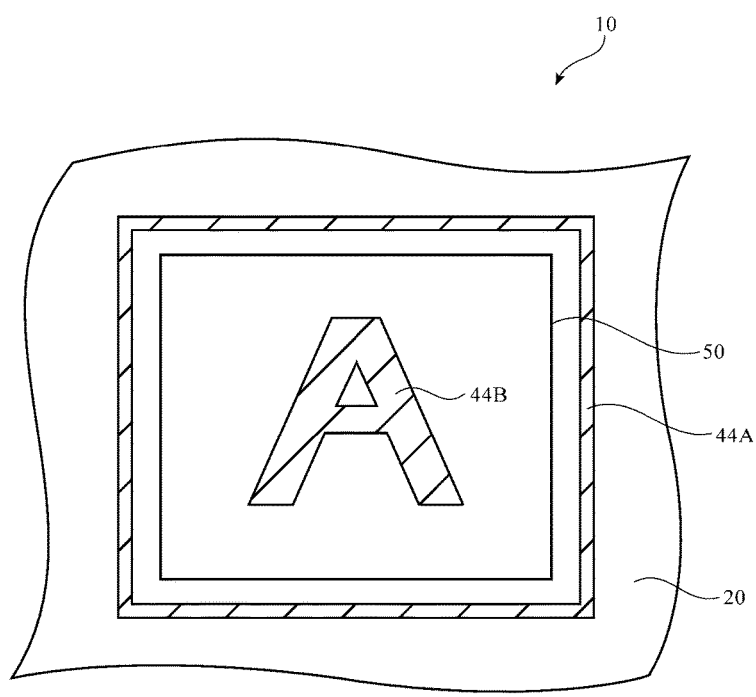
FIG. 4 is a top view of an illuminated structure such as a keyboard key in accordance with an embodiment.

Patterned openings in fabric and/or other materials (see, e.g., layer 20 of FIG. 3) may be used in forming illuminated regions in item 10. As shown in FIG. 4, layer 20 may overlap an input-output component such as key 50. Key 50 may form part of a keyboard in item 10 (e.g., item 10 may be an accessory such as a cover that contains a keyboard or other device that contains keys). Key 50 may be surrounded by an illuminated region such as region 44A that forms an illuminated trim (i.e., an illuminated ring-shaped halo that runs around the periphery of key 50). Key 50 may also have an illuminated region such as region 44B. Region 44B may form a symbol or other pattern. For example, illuminated region 44B may form a label for key 50 (e.g., region 44B may be patterned to form an alphanumeric character such as the letter "A" or other symbol associated with the operation of the key). Regions such as regions 44A and 44B may be formed from transparent portions of an opaque layer (e.g., perforations or larger openings in a fabric or other material that are filled with transparent material, air-filled openings, etc.). In some configurations, printed ink or other coating material may be provided on layer 20 (e.g. on the outer surface of layer 20) to help make a label on key 50 visible to a user in the absence of illumination through regions 44A and/or 44B.

Although illustrative illuminated regions 44A and 44B of FIG. 4 are associated with an input-output device in item 10 such as key 50, this is merely an example. Regions such as regions 44A and 44B may have any suitable size and shape, may be formed on any suitable portion of item 10, may form labels, symbols, text, decorative patterns (e.g., trim), parts of status indicators, parts of displays, parts of buttons (e.g., buttons such as power buttons, volume buttons, sleep/wake buttons, and other buttons besides the keys in a keyboard), may be formed on surfaces of item 10 that are not associated with keys, etc. The illuminated key configuration of FIG. 4 is merely an example.

Light-emitting diodes for item 10 may include bare dies and/or dies that have been mounted on small pieces of substrate material (e.g., small printed circuit board carriers, which may sometimes be referred to as interposers). Bare light-emitting diode dies and/or light-emitting dies on interposers may be mounted on other substrates. Examples of layers of material that may serve as substrates for light-emitting diodes in item 10 include fabric layers, layers of printed circuit material (e.g., rigid printed circuit board material such as fiberglass-filled epoxy and flexible printed circuit material such as sheets of polyimide or other flexible polymer layers), and polymer sheets such as sheets of polyethylene terephthalate (PET). Light-emitting diodes may also be mounted on molded plastic carriers, on machined dielectric structures, or other structures in item 10.

Figure 5:
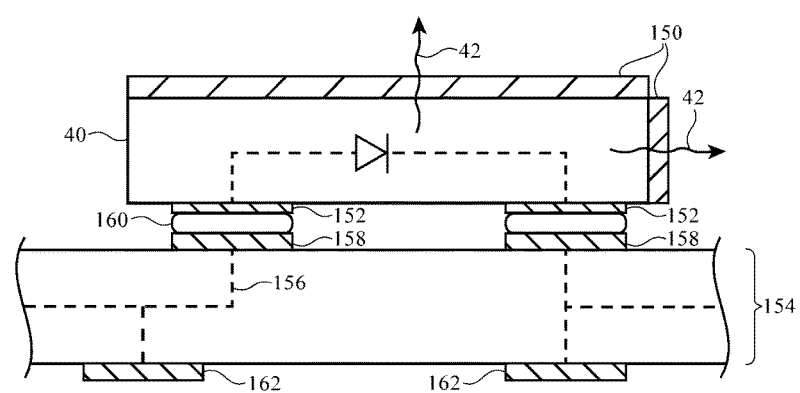
FIG. 5 is a side view of an illustrative light-emitting diode mounted on a substrate in accordance with an embodiment.
Figure 10:
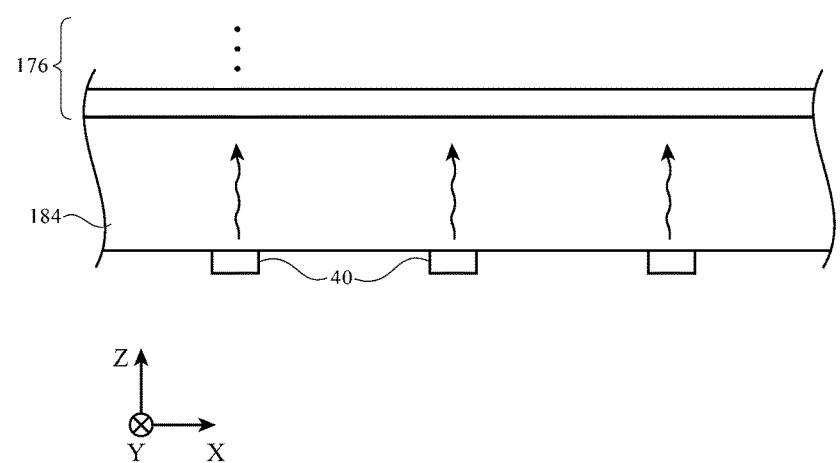
FIG. 10 is a cross-sectional side view of a portion of an illustrative illumination system where light-emitting diodes have been mounted on a transparent substrate through which light from the light-emitting diodes may pass in accordance with an embodiment.

An illustrative light-emitting diode is shown in FIG. 5. As shown in FIG. 10, light-emitting diode 40 may be formed from a crystalline semiconductor die (e.g., a semiconductor die formed from a semiconductor such as indium gallium nitride or other suitable semiconductor material). Light-emitting diode 40 may emit light 42 from its upper surface, lower surface, and/or edge surfaces. Optional coating layers such as layer 150 may be formed on these surfaces. Coating 150 may be formed from a luminescent material. For example, coating 150 may include materials such as phosphors (e.g., YAG phosphors) to down convert light 42 (e.g., blue light) to produce white light. Coating 150 may also include other materials that affect light 42 (e.g., quantum dots that convert blue light to red and/or green light or light of other colors), fluorescent material that converts ultraviolet light from diode 40 into visible light, dyes or pigments that affect the color of light 42, etc. In the example of FIG. 5, these materials have been included as optional coating 150. If desired, luminescent materials or other materials such as the materials of coating 150 may be incorporated into solid plastic structures in item 10, coatings on key structures, coatings on layer 20 (e.g., fabric), or may be incorporated into other structures in item 10.

As shown in FIG. 5, light-emitting diode 40 may have terminals such as contacts 152. When current is applied to diode 40 through contacts 152, light 42 is emitted by light-emitting diode 40. Light-emitting diode 40 may be mounted to a substrate such as substrate 154. Substrate 154 may have signal paths such as signal paths 156. Signal paths 156 may be formed in interior layers of substrate 154 (e.g., when substrate 154 is a printed circuit board) and/or on external surfaces of substrate 154 (e.g., when substrate 154 is a plastic film without any internal signal paths). Portions of signal paths 156 may form contacts 158. Solder or other conductive material 160 may be used to couple light-emitting diode contacts 152 to contacts 158. If desired, contacts 162 may be formed on substrate 154 that allow substrate 154 to be mounted to a printed circuit or other additional substrate in item 10. For example, substrate 154 may be a relatively small interposer substrate on which light-emitting diode 40 (and, if desired, additional semiconductor device(s)) may be mounted. A light-emitting diode of this type (i.e., a light-emitting diode that includes a semiconductor die mounted on an interposer) may be incorporated into item 10 in place of or in addition to incorporating bare light-emitting diode dies into item 10. Configurations in which light-emitting diodes 40 are packaged light-emitting diodes or are formed from thin-film organic light-emitting diode structures may also be used.

Figure 6:
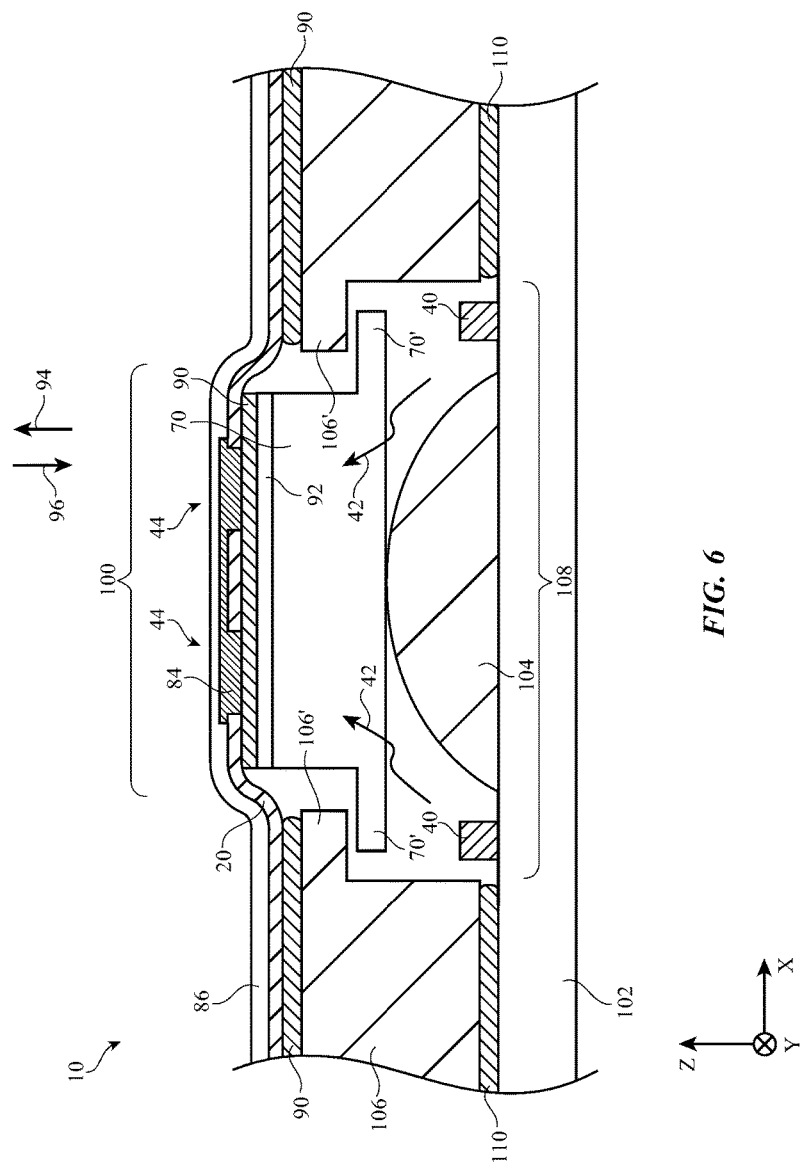
FIG. 6 is a side view of a portion of an illustrative keyboard with illumination in accordance with an embodiment.

A cross-sectional side view of a portion of item 10 in a configuration in which item 10 is an accessory such as a cover for a tablet computer or other electronic device and contains a keyboard is shown in FIG. 6. As shown in FIG. 6, item 10 may have a plastic key member support structure (sometimes referred to as a key web) such as structure 106. A plurality of keys 100 may be formed in item 10. Each key 100 may have a moving key member 70 that is moves in directions 94 and 96 within a respective opening 108 in structure 106. Lip portions 70' of key members 70 and corresponding lip portions 106' of structure 106 may serve as stop structures that help retain key members 70 within openings 108.

Dome switch 104 and, if desired, spring structures may help bias key member 70 in direction 94 when key 100 is not pressed. When key 100 is pressed, the inward force exerted by a user's finger will press key member 70 in inwards direction 96, thereby compressing and activating dome switch 104. Structure 106 may have an array of openings 108 to receive an array of associated key members 70 and an array of corresponding dome switches 104 may be mounted under key members 70. Flexible layer 20 (e.g., a fabric layer) may cover key members 70 and may be attached to structure 106 and key members 70 using adhesive 90.

Layer 20 may contain a layer of fabric or other material with a light-transmitting region formed from opening(s) 44 and/or other structures. The light-transmitting region may form a desired illuminated symbol, label, or other structure for key 100. Coating 84 may be transparent material (translucent, clear, colored, luminescent—i.e., fluorescent or phosphorescent, etc.) and may have an appearance that contrasts visually with the appearance of layer 20. Coating 84 may extend into openings 44 and may have a shape that represents a symbol, label, etc. The shape formed by coating 84 may allow a user to identify key 100 even in the absence of illumination 42. Optional protective layer 86 may be sufficiently transparent to allow a user to view the pattern formed by coating 84 and the pattern of illumination formed when light 42 passes through the transparent region formed from opening(s) 44. The illuminated transparent region formed from openings 44 may include perforations and/or larger symbol-sized openings. If desired, a halo structure such as halo 44A of FIG. 4 (e.g., an illuminated ring shape or other trim pattern) may surround each key 100.

Adhesive 110 may be used to attach key member support structure 106 to a substrate such as printed circuit 102. Printed circuit 102 may be a rigid printed circuit board or a flexible printed circuit (e.g., a printed circuit formed from a flexible polymer substrate such as a layer of polyimide or other sheet of polymer). Configurations in which substrate 102 is a layer of polymer having upper and lower surfaces on which metal traces are formed (and being free of embedded metal traces) may also be used. Light-emitting diodes 40 may be mounted to printed circuit board (substrate) 102 within openings 108 adjacent to dome switch 104 to provide illumination 42 or may be mounted elsewhere within item 10.

Figure 7:
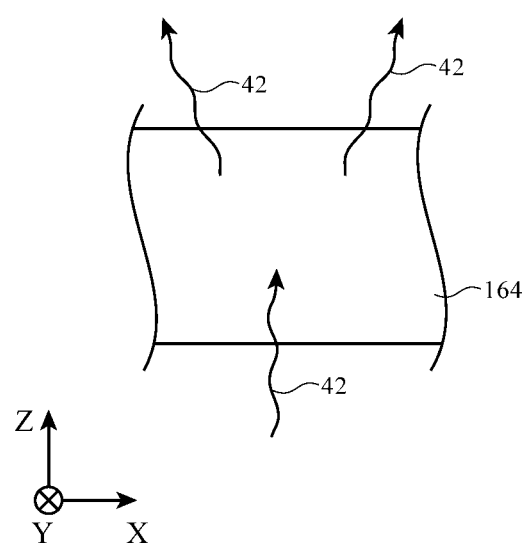
FIG. 7 is a cross-sectional side view of a structure such as a keyboard key member, coating layer, substrate, polymer layer, or other structure that includes luminescent material or light diffusing material in accordance with an embodiment.

As shown in FIG. 7, light 42 in item 10 may pass through transparent structures such as structure 164. Structure 164 may be a key member such as member 70, may be a fabric (e.g., layer 20), a layer of non-fabric material such as a polymer layer (e.g., layer 20, substrate layer 102, other substrate layers, etc.), a support structure, a coating such as coating 84, an adhesive material, and/or other suitable structures in item 10. In some configurations for item 10, structures such as structure 164 may be clear (e.g., transparent and haze free). If desired, structure 164 may contain metal oxide particles or other light scattering particles that impart a haze to structure 164 and render structure 164 translucent (light diffusing). Structures in item 10 such as illustrative structure 164 of FIG. 7 may also include luminescent material (e.g., phosphorescent material such as YAG particles or other phosphors, fluorescent dyes or pigments, quantum dots, etc.). In configurations such as these, light from diode 40 of one color may be converted into light 42 of a different color and/or may exhibit glow-in-the dark (persistent luminescence) properties as light 42 passes through structure 164. Light-emitting diode 40 may, if desired, emit ultraviolet light that is converted into visible light of a desired wavelength using luminescent material (e.g., fluorescent dye or pigment). Luminescent materials such as phosphors, fluorescent materials, diffusing structures such as light scattering particles of metal oxides and other materials, and other light-modifying structures 164 (e.g., gratings, textured surfaces, bubbles and other voids, colored layers, etc.) may be used to help convert light to a desired color and to diffuse light 42, as shown in FIG. 7. These light-adjusting structures may help reduce undesired hotspots in an illuminated region and may ensure that an illuminated region is visible to a user of item 10.

Figure 8:
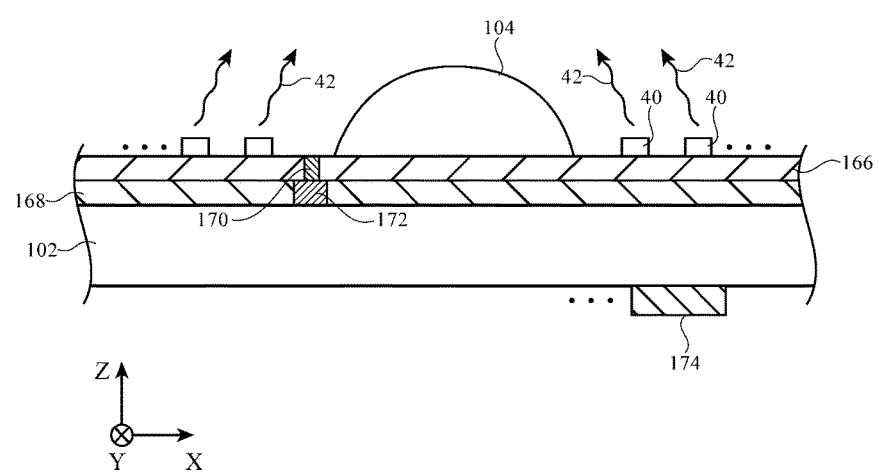
FIG. 8 is a cross-sectional side view of an illustrative substrate such as a polymer layer that has light-emitting diodes and that is mounted to another substrate such as a printed circuit in accordance with an embodiment.

Illustrative illumination system structures of the type that may be used in providing illumination for opening 44 of key 100 of FIG. 6 are shown in FIG. 8. As shown in FIG. 8, light-emitting diodes 40 (bare, on an interposer, or packaged) may be mounted on a substrate that is, in turn, mounted on a support structure such as another substrate. In the example of FIG. 8, light-emitting diodes 40 and dome switch 104 for keyboard key 100 have been mounted on the upper surface of substrate 166. Substrate 166 may be attached to a structure such as printed circuit 102 via adhesive layer 168 or may be otherwise coupled to printed circuit 102 (e.g., using solder, connectors, etc.). Vias such as via 170 in substrate 166 may allow signals associated with light-emitting diodes 40 and switches such as switch 104 to be routed to contacts 172 and other signal paths in substrate 102, which is coupled to substrate 166.

Adhesive layer 168 may be omitted and other attachment mechanisms such as screws and other fasteners, connectors, and other structures may be used in coupling substrates 166 and 102 together. If desired, components such as components 174 (e.g., integrated circuits associated with keyboard key signal processing, light-emitting diode control, etc.) may be mounted on substrate 102. Substrate 166 may be, for example, a polymer layer such as a layer of polyethylene terephthalate (PET). Pieces of the PET material or other polymer may be cut into rectangles or pieces of other shapes and each of these pieces of substrate 166 may be mounted within a respective keyboard key (as an example).

Signal traces may be formed on the upper and/or lower surfaces of substrate 166 (as an example). Substrate 102 may be a rigid or flexible printed circuit and may include multiple sublayers. Configurations in which substrate 166 is a printed circuit board and in which structure 102 is a key member or other structural component of item 10 may also be used, if desired. The configuration of FIG. 8 is merely illustrative. The configuration of FIG. 8 may be used in a key of the type shown in FIG. 7 or other component within item 10.

Figure 9:
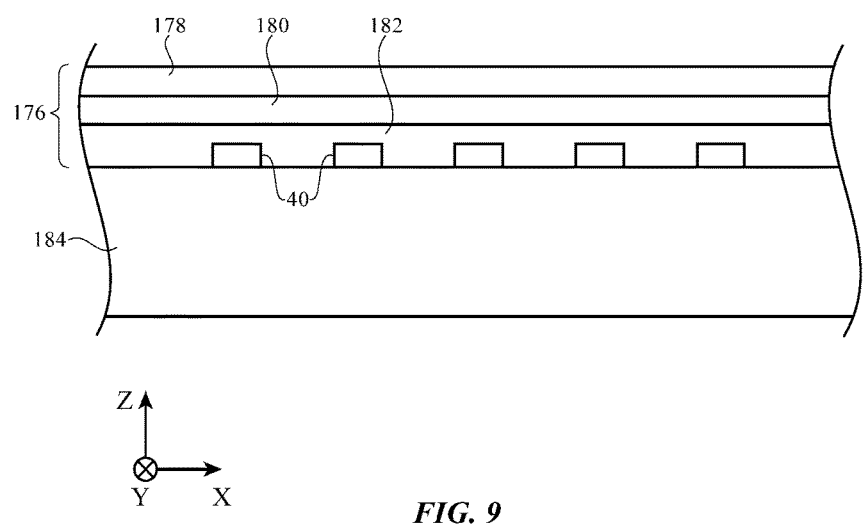
FIG. 9 is a cross-sectional side view of an illustrative illumination system structure formed from light-emitting diodes on a substrate covered with one or more layers of material such as luminescent material, diffusing material, and encapsulant in accordance with an embodiment.

As shown in FIG. 9, layers of material such as layers 176 may overlap light-emitting diodes 40. In the example of FIG. 9, light-emitting diodes 40 are mounted on substrate 184 (e.g., a polymer layer, a fabric layer, a printed circuit, a key member or other structure in item 10, etc.). Layers 176 may include layers such as layers 182, 180, and 178. Layer 182 may be a luminescent material (e.g., a phosphor, a fluorescent material, a dye or pigment that imparts a color, etc.). Diffusing layer 180 may include light-scattering features (voids, particles, etc.) that help diffuse light emitted by diodes 40, as described in connection with FIG. 7. Encapsulant 178 may be formed from a clear polymer and/or inorganic layer that helps protect light-emitting diodes 40 and layers 180 and 182 from moisture. If desired, fewer layers 176 may be used to cover diodes 40 and/or the functions of layer 176 of FIG. 9 may be combined into one, two, or more than two different layers. As an example, a single-layer coating may include luminescent material, light-scattering particles, and encapsulant material.

FIG. 10 shows how light-emitting diodes 40 may be mounted on the lower (inner) surface of structure 184. In this type of configuration, structure 184 may be transparent to allow light 42 to travel through structure 184. Coating(s) 176 may be formed on the upper (outer) surface of structure 184. If desired, luminescent material, colored materials, and/or other materials such as light-diffusing materials and/or structures may be incorporated into layer 184. Structure 184 may be a dielectric substrate such as a polymer layer such as a PET layer, a printed circuit substrate (flexible or rigid), a key member such as key member 70, a fabric layer or other layer such as layer 20 of FIG. 6, or other structure in item 10.

Figure 11:
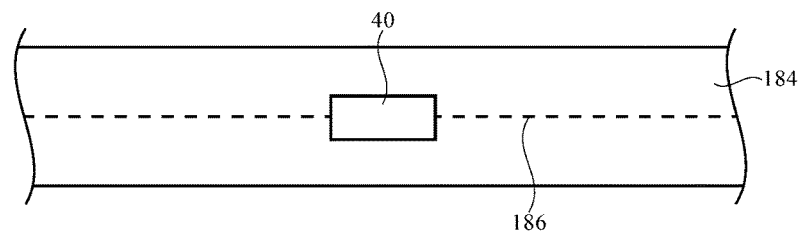
FIG. 11 is a cross-sectional side view of an illustrative layer of material into which a light-emitting diode has been embedded in accordance with an embodiment.
Figure 12:
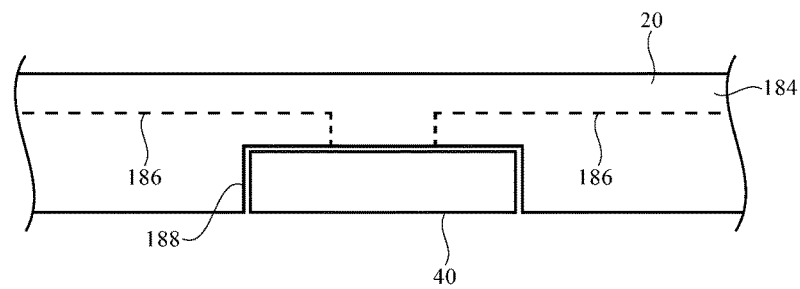
FIG. 12 is a cross-sectional side view of an illustrative layer of material having an outer surface and an opposing inner surface with a recess that may receive a light-emitting diode in accordance with an embodiment.
Figure 13:
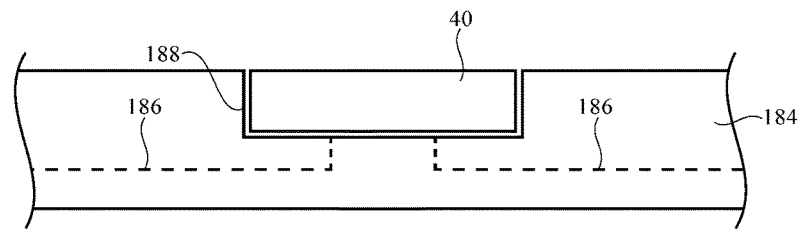
FIG. 13 is a cross-sectional side view of an illustrative layer of material having an inner surface and an opposing outer surface with a recess that may receive a light-emitting diode in accordance with an embodiment.

As shown in FIG. 11, light-emitting diode 40 may be embedded within the interior of structure 184 or other structures in device 10. In the configuration of FIG. 11, structure 184 may be a substrate such as a polymer layer (e.g., a PET layer or other polymer sheet), a printed circuit (flexible or rigid), a key member such as key member 70, a fabric layer or other layer such as layer 20 of FIG. 6, or other structure in item 10. Strands of conductive material (e.g., conductive monofilaments or conductive threads in a fabric) or other conductive signal paths 186 may be coupled to the contacts of light-emitting diode 40 using solder, conductive adhesive, clamps, or other suitable conductive coupling mechanisms. In the example of FIG. 12, light-emitting diode 40 has been mounted in a recess (recess 188) in the lower surface of structure 184. In the example of FIG. 13, light-emitting diode 40 has been mounted in a recess (recess 188) in the upper surface of structure 184. If desired, light-emitting diode 40 may have an outer surface that lies flush with the outer surface of structure 184, as shown in the illustrative configurations of FIGS. 12 and 13.

Figure 14:
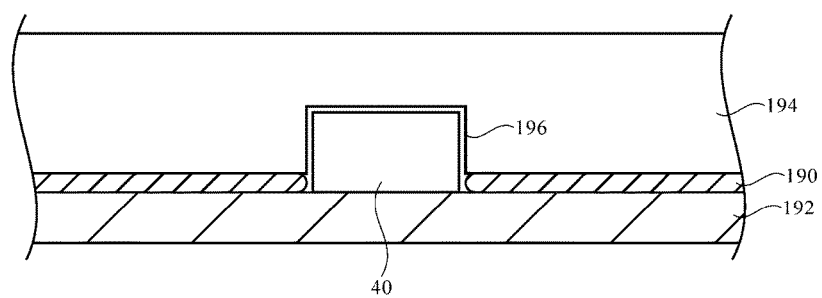
FIG. 14 is a cross-sectional side view of an illustrative lighting system structure in which a light-emitting diode is mounted on a substrate and protrudes into a recess in a layer of material or other structure in accordance with an embodiment.

As illustrated in the configuration of FIG. 14, light-emitting diodes may be mounted on a substrate or other structure so that some or all of the light-emitting diodes protrude into a recess or other opening in an adjacent substrate or other structure. In the example of FIG. 14, light-emitting diode 40 is mounted to a structure such as structure 192 (e.g., a substrate such as a polymer layer, a printed circuit, etc.) and protrudes into recess 196 in structure 194. Adhesive 190 or other attachment mechanisms may be used in coupling structure 194 to structure 192. Structure 194 may be a key member such as key member 70, may be a fabric or other layer such as layer 20, may be a printed circuit board substrate, may be a substrate formed from a polymer sheet such as a PET layer, or may be any other suitable structure with recesses in item 10. Light 42 from diode 40 may propagate through structure 194 and/or through substrate 192. Structure 194 and/or substrate 192 may include light-scattering materials, luminescent materials, colored materials, and/or other light modifying materials and/or structures.

Figure 15:
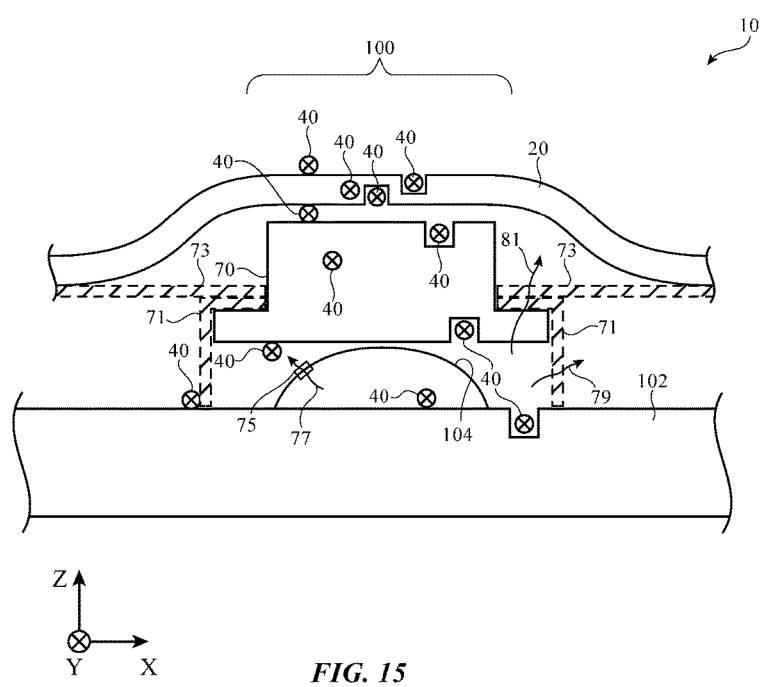
FIG. 15 is a cross-sectional side view of a portion of an electrical component such as a keyboard key showing illustrative light-emitting diode mounting locations in accordance with embodiments.

Illustrative locations at which light-emitting diodes 40 may be incorporated into input-output devices such as key 100 in item 10 are shown in FIG. 15. As shown in FIG. 15, light-emitting diodes 40 may be incorporated into key 100 on an outer surface of layer 20, in recesses in the outer surface of layer 20, in the interior of layer 20, in recesses in the inner surface of layer 20, on the lower (inner) surface of layer 20, on the outer surface of key member 70, in recesses in the outer surface of key member 70, within the interior of key member 70, in recesses on the inner surface of key member 70, on the inner (lower) surface of key member 70 facing substrate 102, on the outer (upper) surface of substrate 102, under the dome of dome switch 104, or in recesses in the upper surface of substrate 102. In each of these illustrative locations and/or in other suitable locations in which diodes 40 are mounted in item 10, diode 40 may be a bare die, a bare die mounted on a printed circuit substrate (i.e., a printed circuit interposer), or a packaged light-emitting diode die, and/or may be mounted on a polymer layer such as a PET sheet or other dielectric substrate. Dome 104 may have openings such as openings 75 to allow light 77 from light-emitting diode 40 under dome 104 to emit light. Openings 75 may be slits, dots, or openings of other shapes that allow light to exit from under dome 104 and that may help scatter and diffuse light 77. Light may also be diffused when passing through the material of a switch housing or other support structures associated with key 100. As shown in FIG. 15, key 100 may be supported by planar key support structure 73 and/or key support structure 71. Structures such as structure 71 may also serve as housings for dome switch 104. Structures such as structures 71 and 73 may be formed from translucent plastic, plastic with one or more perforations or other openings, or other material that allows light to be pass and to be diffused (see, e.g., light 81 from a light-emitting diode 40 that is being diffused while passing through structures 71 and/or 73, and light 79 from a light-emitting diode 40 that is being diffused while passing through a wall of structure 71.

Figure 16:
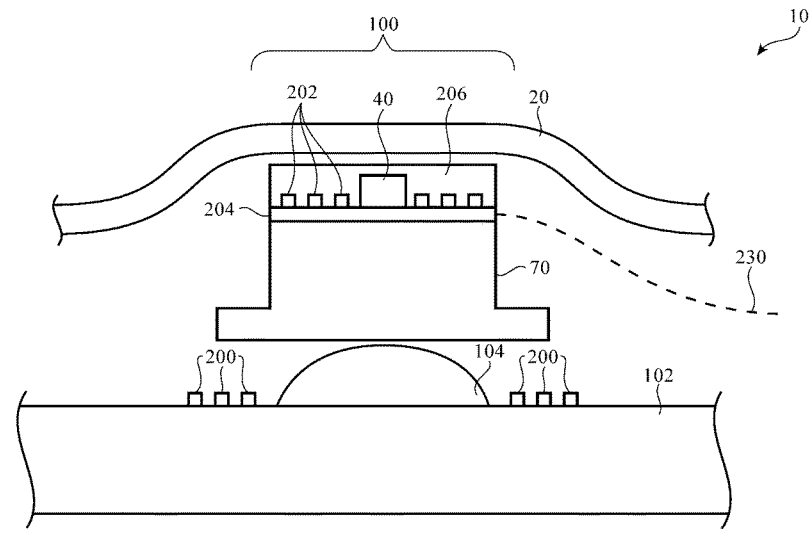
FIG. 16 is a cross-sectional side view of an illustrative keyboard key with a wirelessly powered light-emitting diode in accordance with an embodiment.

If desired, radio-frequency signal coupling techniques may be used to wirelessly power light-emitting diodes 40. This may allow diodes 40 to be mounted on a key member or other portion of item 10 in which diodes 40 move relative to a power source. An illustrative arrangement in which wireless power transfer techniques of this type have been used to power light-emitting diode 40 is shown in FIG. 16. As shown in the example of FIG. 16, wireless power receiving coil 202 may be an inductor formed from multiple loops of metal traces on substrate 204 (e.g., a polymer layer such as a PET layer, a printed circuit substrate, etc.). Light-emitting diodes such as diode 40 may also be mounted on substrate 204. Substrate 204 may be mounted on key member 70 and may be covered with layer 206 (encapsulant, light-diffusing material, luminescent material such as phosphorescent or fluorescent material, etc.). As with layer 20 in the other keyboard arrangements described herein, layer 20 of FIG. 16 may be molded or otherwise preformed (e.g., using heat and pressure) to form the shape of keys 100 and may overlap key member 70. Key member 70 may be used to control dome switch 104 on substrate 102. Wireless power transmitting coil 200 may be formed from loops of metal traces on substrate 102. Coils 200 and 202 are electromagnetically coupled (e.g., inductively coupled) so that power may be wirelessly transferred from coil 200 to coil 202 to power light-emitting diode 40.

Figure 17:
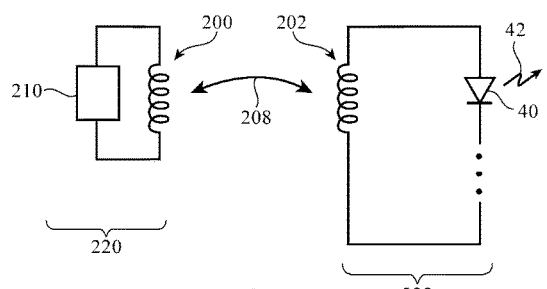
FIG. 17 is a circuit diagram for a wirelessly powered light-emitting diode of the type shown in FIG. 16 in accordance with an embodiment.

A circuit diagram for an illustrative wireless power transfer circuit is shown in FIG. 17. Wireless power transmitter circuit 220 has a power source such as source 210 that supplies signals to transmission coil 200. This causes electromagnetic signals such as alternating current (AC) signals 208 to be received by nearby coil 202 in wireless power receiver circuit 222. Diode 40 rectifies the AC signals received by coil 202 and emits light 42. If desired, a flexible printed circuit or other cable such as cable 230 of FIG. 16 may be used to provide current to light-emitting diodes 40 to power light-emitting diodes 40 in addition to or in place of wireless power transfer circuits such as the circuits of FIG. 17. Cables such as cable 230 of FIG. 16 may be coupled to substrate 102, other printed circuits in item 10 that include power lines, etc.

Figure 18:
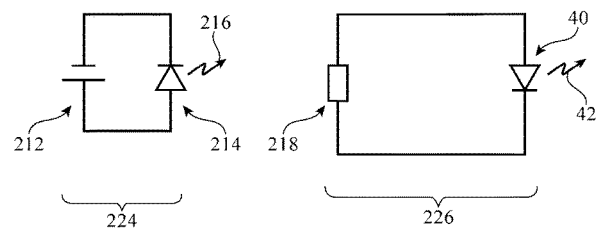
FIG. 18 is a circuit diagram of an illustrative optically powered light-emitting diode circuit of that type that may be used for a light-emitting diode in a keyboard key in accordance with an embodiment.

A circuit diagram for an illustrative light-based wireless power transfer circuit is shown in FIG. 18. With this type of arrangement, wireless power transmitter circuit 224 has a light source such as light-emitting diode 214 that is supplied with current from power source 212. This causes light-emitting diode 214 to emit light 216 (e.g., infrared light) that is received by light detector (photodiode) 218 of light-based wireless power receiver circuit 226. The power produced by the received light at light detector 218 may be used to drive light-emitting diode 40 of circuit 226, thereby producing light 42.

Figure 19:
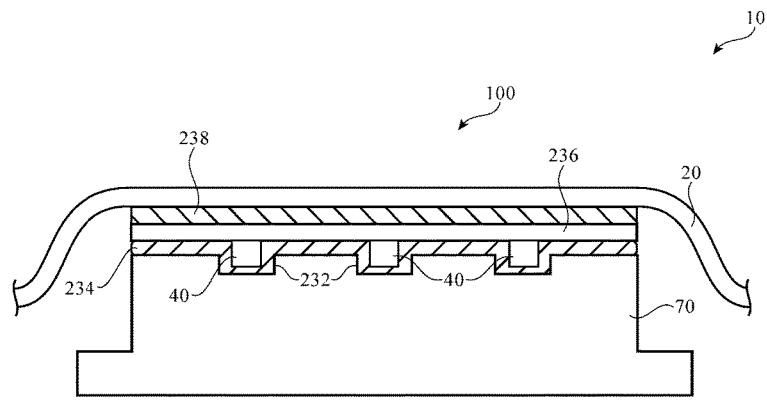
FIG. 19 is a cross-sectional side view of an illustrative structure such as a key member having an upper surface with recesses to accommodate light-emitting diodes in accordance with an embodiment.

In the illustrative configuration of FIG. 19, item 10 includes a structure such as key member 70 of key 100 that has recesses 232 into which light-emitting diodes 40 may protrude. Light-emitting diodes 40 may be mounted on substrate 236 (e.g., a polymer layer such as a PET layer, a printed circuit, etc.). Layers of material such as layers 234 and 238 may be interposed between substrate 236 and member 70 and between substrate 236 and layer 20, respectively. Layers 234 and 238 may include adhesive, luminescent material (e.g., fluorescent material, phosphors, etc.), transparent material for encapsulation and hole filling, opaque material (e.g., patterned black ink for forming a desired illuminated shape), colored material, etc. Light 42 from light-emitting diodes 40 may pass upwards directly through layer 20 (e.g., through symbol shaped openings or other illuminated regions in layer 20) and/or may be reflected through layer 20 after passing through some or all of key member 70. Key member 70 may be formed from transparent plastic and/or other materials and may include luminescent material (e.g., fluorescent material, phosphors, etc.), translucent material, and/or other light-adjusting structures.

Figure 20:
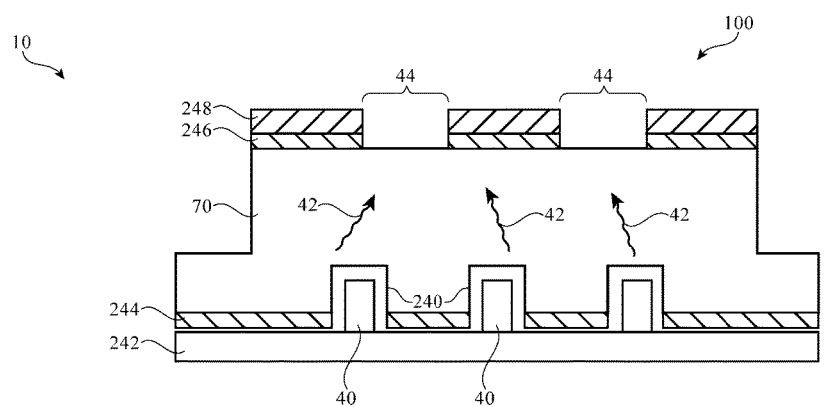
FIG. 20 is a cross-sectional side view of an illustrative structure such as a key member having a lower surface with recesses to accommodate light-emitting diodes in accordance with an embodiment.

FIG. 20 shows how structures such as keys 100 in item 10 may be provided with reflective layers. In the example of FIG. 20, member 70 is transparent. Light-emitting diodes 40 are mounted on substrate 242 and protrude into recesses 240 in member 70. An opaque layer such as layer 248 (e.g., a layer of black ink) may have openings 44 with the shape of a symbol or other shape. Openings 44 in layer 248 along with any overlapping openings in a fabric or other layer 20 may form light-transmitting regions for keys 100. Light 42 from light-emitting diodes 40 may pass through openings 44 and other layers in the light-transmitting regions to illuminate the light-transmitting regions (e.g., a symbol that serves as a key label).

Reflective coatings such as reflective layers 244 and 246 may be formed on the surfaces of key member 70 (e.g., the upper and lower surfaces of key member 70, the edges of key member 70, etc.). The reflective coating material on key member 70 may help reflect stray light 42 from light-emitting diodes 40, thereby enhancing the efficiency with which light 42 passes through openings 44 in opaque layer 248. Reflective coatings such as layers 246 and 244 may have openings aligned with openings 44 in opaque layer 248 and recesses 240, respectively. Layers 246 and 244 may be formed from a reflective stack of alternating high and low index-of-refraction dielectric materials, may be formed from white ink (e.g., a polymer with titanium dioxide particles or other white particles), may be formed from metal, or may be formed from other reflective material.

Figure 21:
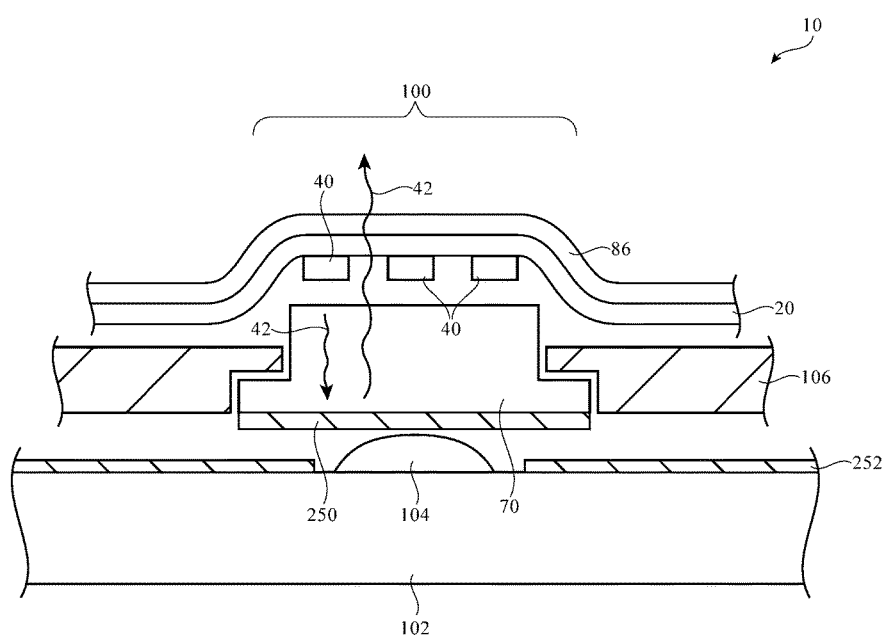
FIG. 21 is a cross-sectional side view of a portion of an illustrative keyboard with illumination and light reflection structures in accordance with an embodiment.

In the illustrative arrangement of FIG. 21, light-emitting diodes 40 have been mounted to layer 20 (e.g., by coupling contacts in diodes 40 to conductive strands of material in a fabric in layer 20, by coupling contacts in diodes 40 to metal traces on a polymer layer or other layer in layer 20, etc.). If desired, light-emitting diodes 40 may be embedded within layer 20 or may be formed within recesses in layer 20. Layer 20 may be a fabric layer or may be formed from other materials (e.g., a sheet of PET or other polymer, etc.). Optional protective coating layer 86 may be formed over the exterior surface of layer 20. Transparent regions in layer 20 (e.g., transparent portions of fabric, clear plastic structures, air-filled openings, or other transparent structures) may have the shape of symbols or other shapes and may be illuminated by light 42 that is emitted by light-emitting diodes 40. A patterned layer of black ink or other opaque material may be incorporated into layer 20 to help define the light-transmitting shape that is illuminated by light 42.

Key member 70 may be received within an opening in support structure 106. During operation, key member 70 may be used to control a switch such as dome switch 104 on substrate 102. To help recycle light 42 that has been emitted by light-emitting diodes 40 and thereby enhance efficiency, reflective structures may be formed within key 100. As shown in FIG. 21, for example, the inner surface of key member 70 may be covered with reflective coating 250 to help reflect light 42 outwards through light-transmitting regions in layer 20. If desired, the upper surface of substrate 102 may also be covered with reflective material such as reflective layer 252 to help reflect light 42 upwards and out of key 100. Layer 252 may be a white layer (e.g., a white reflective polymer layer such as white coverlay on a printed circuit board), may be a reflective metal layer, may be a reflector formed from alternating high and low index-of-refraction materials, or may be formed from other reflective structures. Layer 250 may be a may be a white layer such as a white polymer layer, may be a metal layer, may be a reflector formed from alternating high and low index-of-refraction materials, or may be formed from other reflective structures.

As with the other illustrative arrangements for item 10, the structures of FIG. 21 and, if desired, additional layer(s) of material in item 10 may include luminescent material (e.g., phosphors or fluorescent material) for adjusting the appearance of light 42 and any light-transmitting regions illuminated by light 42, may include light-diffusing structures (e.g., one or more layers of polymer that include light-scattering features such as voids, inorganic light-scattering particles, other light-scattering structures, dyes, pigments, etc.), colored material, transparent material such as clear haze free polymer for encapsulating sensitive components, etc.

The foregoing is merely illustrative and various modifications can be made by those skilled in the art without departing from the scope and spirit of the described embodiments. The foregoing embodiments may be implemented individually or in any combination.

What is claimed is:

1. A keyboard, comprising:
   an array of key members;
   a layer of material that overlaps the array of key members and extends across the keyboard, wherein the layer of material has a light-transmitting region over a respective one of the key members;
   a light-emitting diode that produces light; and
   a luminescent material that produces illumination for the light-transmitting region in response to receiving the light from the light-emitting diode.

2. The keyboard defined in claim 1 wherein the layer of material comprises a layer of opaque material having a symbol-shaped opening.

3. The keyboard defined in claim 1 wherein the layer of material comprises a layer of fabric.

4. The keyboard defined in claim 1 wherein the light produced by the light-emitting diode comprises ultraviolet light and wherein at least some of the illumination produced by the luminescent material comprises visible light.

5. The keyboard defined in claim 1 wherein the light produced by the light-emitting diode comprises blue light and wherein at least some of the illumination produced by the luminescent material comprises white light.

6. The keyboard defined in claim 1 wherein the luminescent material is located in the respective one of the key members.

7. The keyboard defined in claim 1 wherein the respective one of the key members is movable and wherein the luminescent material comprises a coating on the respective one of the key members.

8. The keyboard defined in claim 1 wherein the luminescent material comprises a coating on the layer of material.

9. A keyboard, comprising:
   a first substrate;
   a light-emitting diode on the first substrate that produces light;
   a layer of material having at least one light-transmitting region that is illuminated by the light, wherein the layer of material comprises fabric and wherein the light-transmitting region has a symbol shape; and
   a second substrate that overlaps the first substrate.

10. The keyboard defined in claim 9 wherein the first substrate is coupled to the second substrate and wherein the first substrate comprises a layer of polymer.

11. The keyboard defined in claim 10 further comprising a dome switch mounted to the layer of polymer.

12. The keyboard defined in claim 11 wherein the second substrate comprises a printed circuit having contacts coupled to signal paths in the first substrate, wherein signals are provided to the light-emitting diode on the first substrate through the signal paths.

13. The keyboard defined in claim 9 further comprising:
a switch on the first substrate; and
a movable key member that controls the switch, wherein the first substrate is coupled to the second substrate.

14. The keyboard defined in claim 9 further comprising an opaque layer having an opening that is aligned with the light-transmitting region.

15. The keyboard defined in claim 9 further comprising:
wireless power transmitter circuitry that transmits wireless power; and
wireless power receiver circuitry that receives the transmitted wireless power and that powers the light-emitting diode.

16. The keyboard defined in claim 15 wherein the wireless power transmitter circuitry includes a first inductor coil and wherein the wireless power receiver circuitry includes a second inductor coil that receives the transmitted wireless power.

17. The keyboard defined in claim 16 wherein the first substrate includes metal traces that form the second inductor coil, wherein the light-emitting diode is coupled to the second inductor coil.

18. The keyboard defined in claim 15 wherein the wireless power transmitter circuitry includes a light source, wherein the wireless power receiver circuitry includes a light detector coupled to the light-emitting diode, and wherein the light detector receives light from the light source in the wireless power transmitter circuitry.

19. A keyboard, comprising:
fabric with a light-transmitting region, wherein the light-transmitting region comprises at least first and second holes in the fabric;
a keyboard key member formed from a translucent material, wherein the first and second holes in the fabric overlap the keyboard key member; and
a light-emitting diode that produces illumination for the light-transmitting region that is diffused by the translucent material.

20. The keyboard defined in claim 19 further comprising a layer of opaque material interposed between the fabric and the keyboard key member, wherein the layer of opaque material has an opening that overlaps the light-transmitting region.

21. The keyboard defined in claim 20 wherein the opening that overlaps the light-transmitting region comprises a symbol-shaped opening.

22. The keyboard defined in claim 19 wherein the light-emitting diode comprises a crystalline semiconductor die, the keyboard further comprising:
a polymer sheet on which the light-emitting diode is mounted.

23. The keyboard defined in claim 22 further comprising a printed circuit board that is coupled to the polymer sheet.

24. The keyboard defined in claim 19 further comprising a dome switch with a dome that covers the light-emitting diode, wherein the dome has at least one opening through which light from the light-emitting diode passes.

25. A keyboard, comprising:
a substrate;
a light-emitting diode mounted on the substrate;
a layer of material having a symbol-shaped light-transmitting region that is illuminated by light from the light-emitting diode, wherein the layer of material extends across the keyboard; and
a reflective coating that reflects at least some of the light.

26. The keyboard defined in claim 25 further comprising:
a switch; and
a key member that moves to control the switch.

27. The keyboard defined in claim 26 wherein the reflective coating is on the key member.

28. The keyboard defined in claim 26 wherein the reflective coating is on the substrate.

* * * * *